(12) United States Patent
Chen et al.

(10) Patent No.: US 12,289,862 B2
(45) Date of Patent: Apr. 29, 2025

(54) FORCE CONVECTION DRIVEN BY PROPELLER APPLIED IN SINGLE-PHASE IMMERSION COOLING

(71) Applicant: Quanta Computer Inc., Taoyuan (TW)

(72) Inventors: Chao-Jung Chen, Taoyuan (TW); Yu-Nien Huang, Taoyuan (TW); Chang-Yu Chiang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 177 days.

(21) Appl. No.: 18/154,791

(22) Filed: Jan. 13, 2023

(65) Prior Publication Data

US 2024/0164054 A1    May 16, 2024

Related U.S. Application Data

(60) Provisional application No. 63/383,965, filed on Nov. 16, 2022.

(51) Int. Cl.
*H05K 7/20* (2006.01)
*F04D 3/00* (2006.01)
*F04D 29/18* (2006.01)

(52) U.S. Cl.
CPC ......... *H05K 7/20272* (2013.01); *F04D 3/005* (2013.01); *F04D 29/181* (2013.01); *H05K 7/20236* (2013.01); *H05K 7/20772* (2013.01)

(58) Field of Classification Search
CPC .......... H05K 7/20272; H05K 7/20236; H05K 7/20772; F04D 3/005; F04D 29/181; F04D 13/14; F04D 13/08; F05D 2250/315
See application file for complete search history.

(56) References Cited

U.S. PATENT DOCUMENTS

| | | | | |
|---|---|---|---|---|
| 4,233,116 | A * | 11/1980 | Mangus | G21C 15/247 376/403 |
| 5,967,863 | A * | 10/1999 | Marchant | B63H 20/007 440/52 |
| 10,568,234 | B1 * | 2/2020 | Mao | H05K 7/20781 |
| 2011/0150676 | A1 * | 6/2011 | Buzit | F04D 9/008 417/410.1 |
| 2018/0153058 | A1 * | 5/2018 | Hirai | H05K 7/20236 |
| 2020/0288600 | A1 * | 9/2020 | Gao | H05K 7/20272 |
| 2020/0288601 | A1 * | 9/2020 | Gao | H05K 7/20272 |
| 2022/0248558 | A1 * | 8/2022 | Lin | H05K 7/20327 |

* cited by examiner

*Primary Examiner* — Jacob R Crum
(74) *Attorney, Agent, or Firm* — NIXON PEABODY LLP

(57) ABSTRACT

A single-phase immersion cooling system includes an immersion cooling tank having a component area, which is separate from a main chamber and is configured to receive a heat-generating electronic device. A coolant circulates along a flow path, in a chamber path through the main chamber and a component path through the component area. A rotating propeller is mounted within the immersion cooling tank, causing a driven flow path in the component area. The driven flow path is configured to cause contact between the coolant in the driven flow path and the heat-generating electronic device when the heat-generating electronic device is received within the component area. The coolant in the driven flow path circulates at a faster speed than the coolant in the chamber path.

18 Claims, 5 Drawing Sheets

FORCE CONVECTION DRIVEN BY PROPELLER APPLIED IN SINGLE-PHASE IMMERSION COOLING

RELATED APPLICATIONS

This application claims priority to and the benefit of U.S. Provisional Application No. 63/383,965, filed on Nov. 16, 2022, which is incorporated herein by reference in its entirety.

FIELD OF THE INVENTION

The present invention relates generally to liquid cooling of a heat-generating electronic device, and more specifically, to an immersion cooling tank with a rotating propeller causing a driven flow path.

BACKGROUND OF THE INVENTION

Many computer systems, and especially server systems, include heat-generating electronic devices, such as servers, that require cooling for proper and efficient working condition. Typically, present cooling configurations in server designs lack sufficient cooling. For example, air cooling is not enough to cool heat generated by continuing demands of high-power components. In another example, to overcome cooling problems with air cooling, a working fluid is sometimes introduced as a coolant in a single-phase immersion cooling. However, most single-phase immersion cooling systems use natural convection to cool a heated component. Natural convection fails to adequately cool the heat generated by ever-increasing power demands of present computer systems, including server systems.

Thus, the present disclosure provides a solution to the above and other cooling problems.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a single-phase immersion cooling system includes an immersion cooling tank, a coolant, and a rotating propeller. The immersion cooling tank has a main chamber and a component area. The component area is separate from the main chamber and is configured to receive a heat-generating electronic device. The coolant fills the immersion cooling tank and circulates along a flow path that includes a chamber path and a component path. The coolant in the chamber path flows through the main chamber, and the coolant in the component path flows through the component area. The rotating propeller is mounted within the immersion cooling tank, and causes a driven flow path in the component area. The driven flow path is configured to cause contact between the coolant in the driven flow path and the heat-generating electronic device when the heat-generating electronic device is received within the component area. The coolant in the driven flow path circulates at a faster speed than the coolant in the chamber path.

According to another aspect of the present disclosure, the single-phase immersion cooling system includes an inlet funnel that is located within the component area, prior to the coolant reaching the rotating propeller. The inlet funnel focuses the coolant towards the rotating propeller for enhancing cooling of the component area.

According to another aspect of the present disclosure, the inlet funnel is in the form of a bell shape.

According to another aspect of the present disclosure, the component area is defined at least in part by a component-area wall, and the inlet funnel is defined by a funnel surface extending between a funnel entry end and a funnel exit end. The funnel surface extends to the component-area wall at the funnel entry end, and is separated by a gap from the component-area wall at the funnel exit end.

According to another aspect of the present disclosure, the single-phase immersion cooling system further includes a motor that is mechanically coupled to a transmission shaft. The transmission shaft transmits a rotatable force from the motor to the rotating propeller.

According to another aspect of the present disclosure, the motor is located external to the immersion cooling tank.

According to another aspect of the present disclosure, the motor is mounted to the immersion cooling tank.

According to another aspect of the present disclosure, the transmission shaft has an internal shaft portion and an external shaft portion. The internal shaft portion extends within the main chamber of the immersion cooling tank and is mechanically coupled to the rotating propeller. The external shaft portion extends outside the immersion cooling tank and is mechanically coupled to the motor.

According to another aspect of the present disclosure, the transmission shaft includes a transmission gear that is mechanically coupled with a propeller gear for transmitting a rotatable force to the rotating propeller.

According to another aspect of the present disclosure, the propeller gear is mounted on a propeller shaft, the propeller shaft being generally perpendicular to the transmission shaft.

According to another aspect of the present disclosure, the component area is configured to have a shape and size for receiving a server tray or server chassis.

According to another aspect of the present disclosure, the single-phase immersion cooling system includes a pair of motors. The motors are mechanically configured to cause rotation of the rotating propeller. A first motor of the pair of motors continues to cause the rotation when failure of a second motor of the pair of motors is detected.

According to other aspects of the present disclosure, a single-phase immersion cooling system includes an immersion cooling tank, a coolant, and one or more rotating propellers. The immersion cooling tank has a main chamber and a plurality of component areas. Each component area of the plurality of component areas forms an internal component space that is separate from other ones of the plurality of component areas and is separate from the main chamber. The internal component space is configured to receive a heat-generating electronic device. The coolant circulates in a flow path that includes a chamber path and a component path. The coolant in the component path flows through the internal component space of each component area. The one or more rotating propellers are mounted within the immersion cooling tank and cause a rotating flow path in the internal component space of each component area. The rotating flow path causes driven coolant to make contact with the heat-generating electronic device, when the heat-generating electronic device is received within the internal component space of a respective component area of the plurality of component areas. The driven coolant flows at a faster speed than the coolant flowing through the main chamber outside the internal component space of each component area.

According to another aspect of the present disclosure, the one or more rotating propellers include a plurality of rotating propellers. Each rotating propeller of the plurality of rotating propellers is mounted within a respective internal component space of the plurality of component areas.

According to another aspect of the present disclosure, the single-phase immersion cooling system includes at least one motor mechanically coupled to a transmission shaft. The transmission shaft is mechanically coupled, and transmits a rotatable force, to each of the one or more rotating propellers.

According to another aspect of the present disclosure, the transmission shaft includes a plurality of transmission gears. At least one transmission gear of the plurality of transmission gears is mechanically coupled with one or more propeller gears of the one or more rotating propellers.

According to another aspect of the present disclosure, the one or more propeller gears include a plurality of propeller gears. Each transmission gear of the plurality of transmission gears is mechanically coupled with a respective propeller gear of the plurality of propeller gears.

According to another aspect of the present disclosure, at least one of the plurality of transmission gears and the one or more propeller gears is a bevel gear.

According to yet other aspects of the present disclosure, a method for cooling a server device includes providing a coolant in an immersion cooling tank, which has a main chamber and a component area. The method further includes circulating the coolant along a flow path that includes a chamber path and a component path. The coolant in the chamber path flows through the main chamber, and the coolant in the component path flows through the component area. The method further includes rotating a propeller to move the coolant in the component path at a faster speed than the coolant in the main chamber. The coolant in the component path making contact with, and cooling, the server device when the server device is received within the component area.

According to another aspect of the present disclosure, the method further includes forcing the coolant through an inlet funnel before the coolant reaches the propeller. The inlet funnel narrows the flow path from a funnel entry end to a funnel exit end. The funnel entry end is located near an entrance to the component area. The funnel exit end is located away from the entrance and near the propeller.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1:
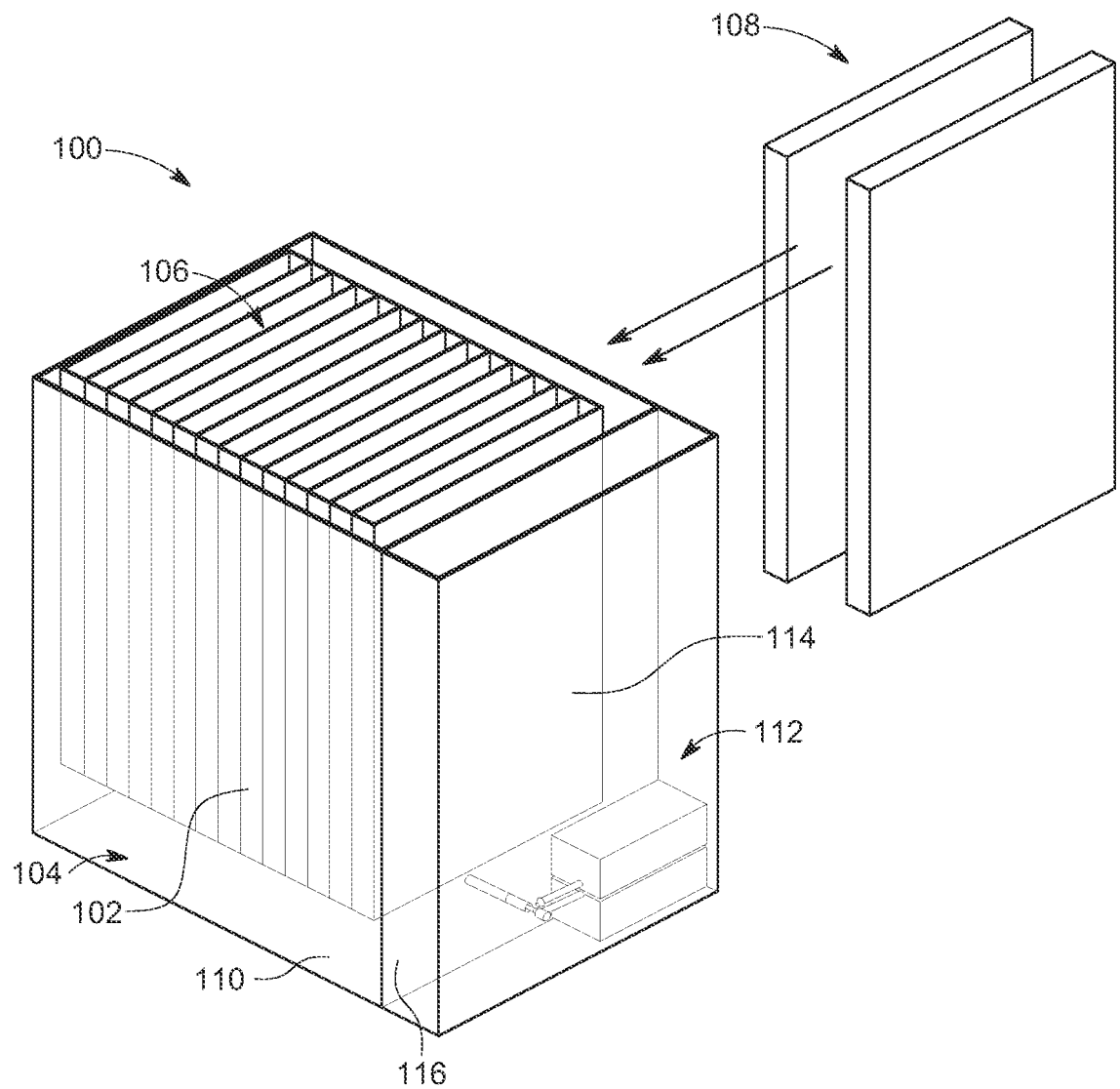
FIG. 1 is an isometric illustration showing a cooling system, according to certain aspects of the present disclosure.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right,"

"above," and "below" are intended to relate to the equivalent direction as depicted in a reference illustration; as understood contextually from the object(s) or element(s) being referenced, such as from a commonly used position for the object(s) or element(s); or as otherwise described herein.

Generally, and by way of example, the present disclosure describes a single-phase immersion cooling system and method in which one or more rotating devices (e.g., propellers) create force convection to improve cooling capacity. More specifically, in one example, a transmission shaft is positioned in a bottom portion of an immersion cooling tank to drive propellers via optional bevel gears. The rotating propellers force a coolant to flow at a fast rate, resulting in cooling heat-generating components, such as servers mounted within the immersion cooling tank. The servers are provided in respective server trays or server chassis. The cooling design is optionally configured to result in a force-convection capacity that is consistent for each server, thus, avoiding different power overheating or overcooling of different servers.

The rotating device is optionally combined with a funnel component to further increase the cooling capacity. If fluid speed insufficient, the funnel component is added to concentrate the coolant towards the rotating device, resulting in an even faster and more efficient cooling fluid flow. Further yet, the rotating device optionally produces a jet flow into the server trays or server chassis, which optionally reduces the required number of rotating devices in the system.

In a further optional configuration, the system and method includes a redundant motor arrangement to avoid, or greatly reduce, the likelihood of the cooling capacity stopping or failing because of motor maintenance or damage. Thus, by way of example, one motor of two or more motors is shut down and easily removed when the one motor requires maintenance or is damaged. While the motor stops operating, the system continues to work with the desired cooling capacity through the other motors.

Referring to FIG. 1, a single-phase immersion cooling system 100 includes an immersion cooling tank 102 having a main chamber 104 and a plurality of component areas 106. The component areas 106 are separate from the main chamber 104, with each component area 106 being configured to receive a respective heat-generating electronic device 108. The component areas 106 are arranged in a side-by-side configuration, with each component area 106 being stacked next to at least one adjacent component area 106.

The heat-generating electronic device 108 includes, for example, a server in a server tray or a server chassis. Thus, according to this example, a server tray is received, respectively, in each of the component areas 106. Accordingly, each component area 106 is configured with a designed configuration that has a shape and/or size for accommodating within a respective server tray or server chassis of the server 108. The servers 108 are removable and insertable within the component areas 106 by an operator.

The cooling tank 102 is filled with a coolant 110, which flows through the main chamber 104 and the plurality of component areas 106. As disclosed in more detail below, the coolant 110 flows at different speeds throughout the cooling tank 102.

The cooling system 100 further includes one or more motors 112. Each of the motors 112 are mounted external to the cooling tank 102 in an external environment 114. By way of example, the motors 112 are mounted to an external surface of the cooling tank 102, near a lower end of a right side 116. For clarity, it is further noted that the external environment 114 is exposed only to air, being a non-liquid area that excludes the coolant 110.

Figure 2:
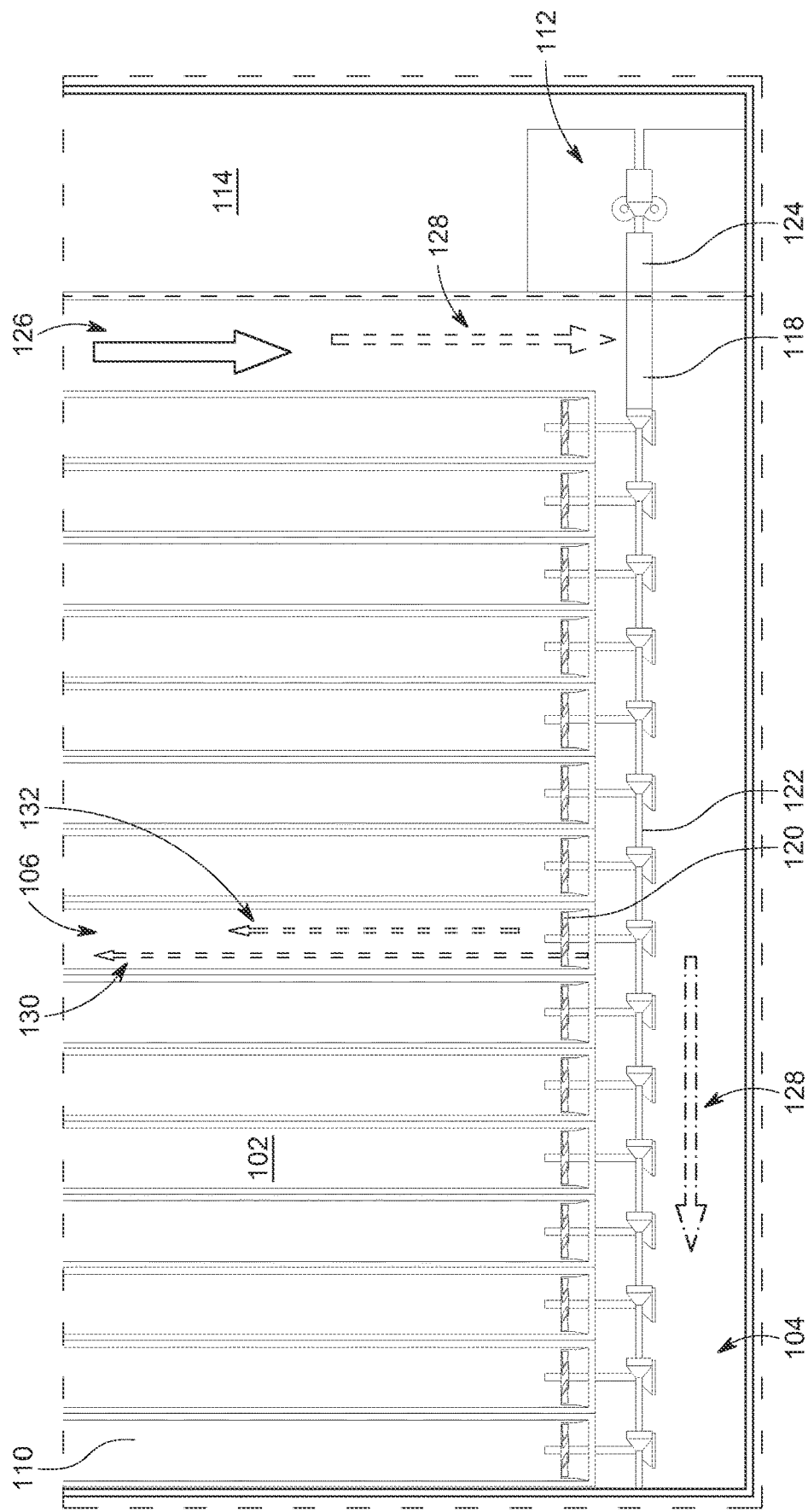
FIG. 2 is a side illustration showing components of the cooling system shown in FIG. 1, according to other aspects of the present disclosure.

Referring to FIG. 2, the motor 112 is mechanically coupled to a transmission shaft 118, which transmits a rotatable force from the motor 112 to a plurality of rotating propellers 120. The transmission shaft 118 has an internal shaft portion 122 and an external shaft portion 124. The internal shaft portion 122 extends within the main chamber 104 of the cooling tank 102 and is mechanically coupled to the rotating propellers 120. The external shaft portion 124 extends outside the cooling tank 102 and is mechanically coupled to the motor 112 in the external environment 114.

The coolant 110 circulates along a flow path 126 that includes a chamber path 128 and a component path 130. The coolant 110 in the chamber path 128 flows through the main chamber 104. The coolant 110 in the component path 130 flows through the component area 106.

The plurality of rotating propellers 120 are mounted within the cooling tank 102 and cause a driven flow path 132 in the component areas 106. The driven flow path 132 is configured to cause respective contact between the coolant 110, which is in the driven flow path 132, and the heat-generating electronic devices 108 (shown in FIG. 1) when they are received within the component areas 106. The coolant 110 in the driven flow path 132 circulates at a faster speed than the coolant 110 in the chamber path 128.

Figure 3:
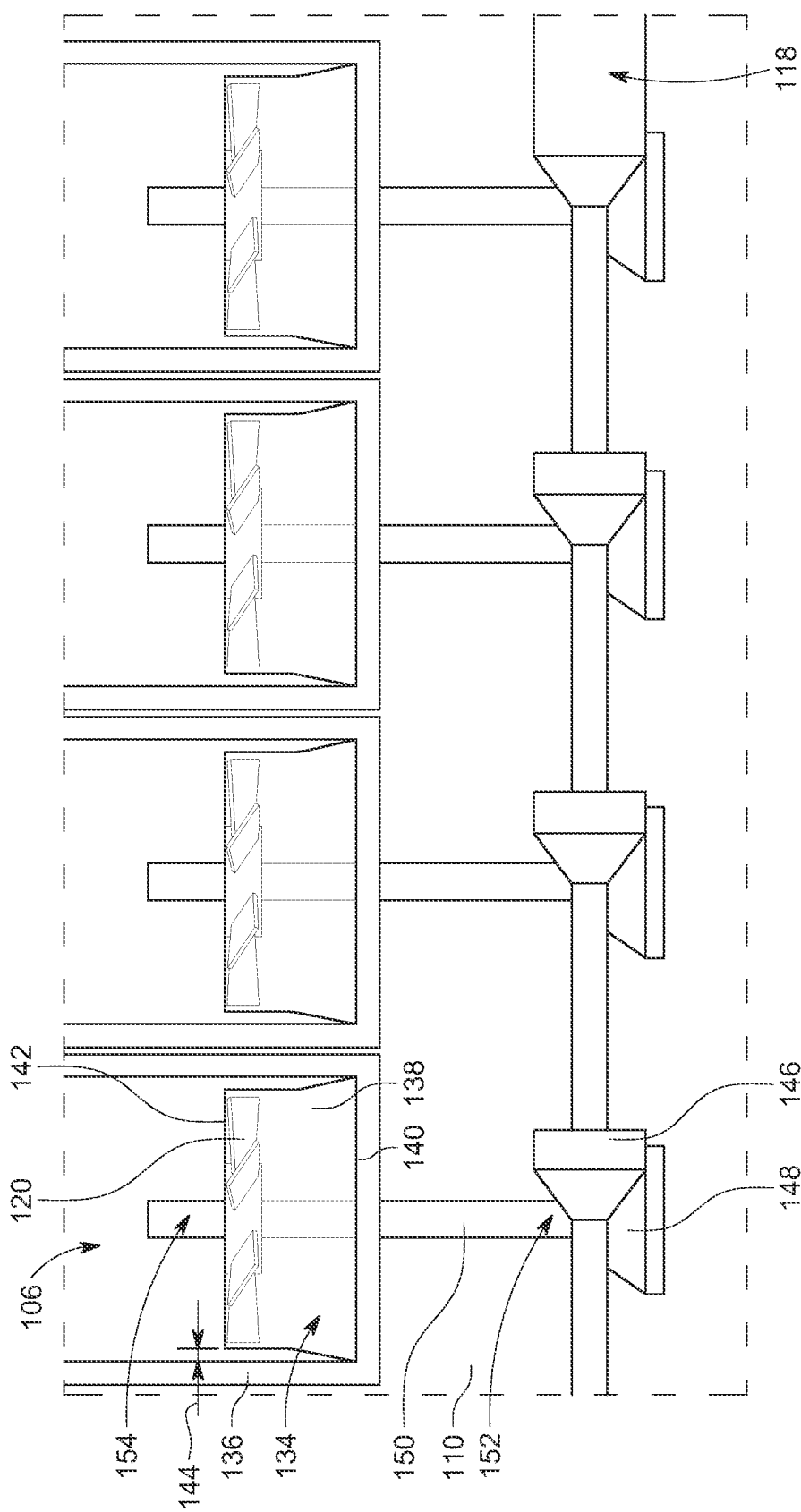
FIG. 3 is a side cross-sectional illustration showing transmission of force into a component area of the cooling system of FIG. 1, according to yet other aspects of the present disclosure.

Referring to FIG. 3, an inlet funnel 134 is optionally located within each component area 106 for focusing, or concentrating, the coolant 110 towards the respective rotating propeller 120. The inlet funnel 134 helps enhance the cooling of the component area 106, achieving a faster coolant flow than otherwise achieved without the inlet funnel 134.

The inlet funnel 134 is located in the component area 106 and is optionally in the form of a bell shape. The coolant 110 flows through the inlet funnel 134 prior to reaching the rotating propeller 120 and is optionally in the form of a bell shape. The component area 106 is defined at least in part by a component-area wall 136. The inlet funnel 134 is defined by a funnel surface 138 that extends between a funnel entry end 140 and a funnel exit end 142. The funnel surface 138 extends generally to the component-area wall 136 at the funnel entry end 140. The funnel surface 138, however, is separated by a gap 144 from the component-area wall 136 at the funnel exit end 142.

The transmission shaft 118 includes a plurality of transmission gears 146 that are mechanically coupled to respective propeller gears 148 for transmitting a rotatable force to the rotating propellers 120 via a propeller shaft 150. Optionally, one or more of the transmission gears 146 and the propeller gears 148 are in the form of bevel gears. Each propeller gear 148 is mounted on a propeller shaft 150, which according to the illustrated example is generally perpendicular to the transmission shaft 118. The propeller gear 148 is mounted near one end 152 of the propeller shaft 150, while the rotating propeller 120 is mounted near an opposite end 154 of the propeller shaft 150.

The rotating propellers 120 are located near a bottom of the component areas 106, which are oriented in a general vertical orientation. In alternative configurations, the rotating propeller 120 is located in other locations, such as near a top or middle of the component area 106, and the component areas 106 are oriented in a general horizontal orientation or an angled orientation.

Figure 4:
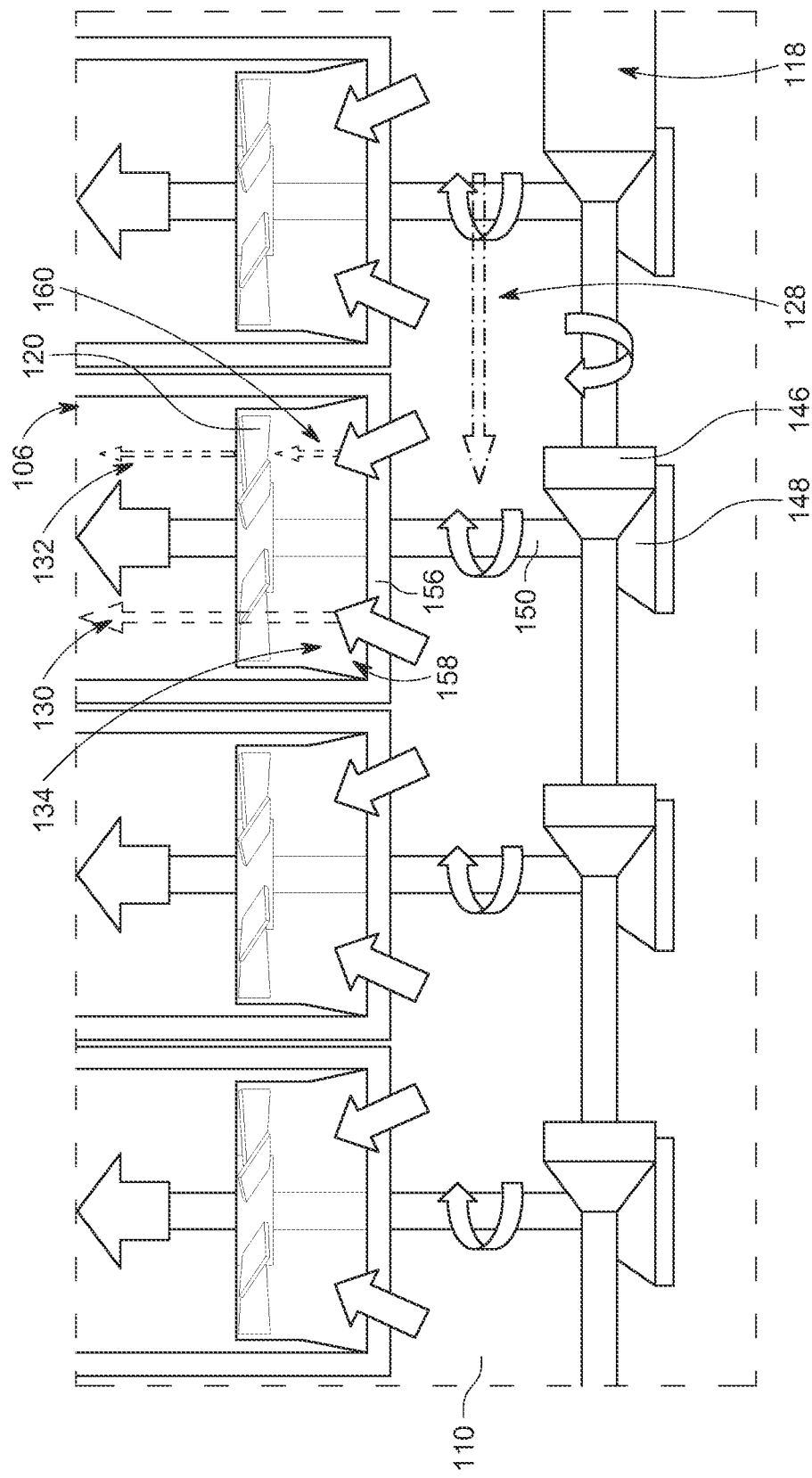
FIG. 4 is a side cross-sectional illustration showing forced convection cooling of the cooling system of FIG. 1, according to yet other aspects of the present disclosure.

Referring to FIG. 4 to illustrate imparted mechanical motion, the transmission shaft 118 rotates in a clockwise direction to cause rotation of the transmission gears 146. The mechanical connection between the transmission gears 146 and the propeller gears 148 cause clockwise rotation of the propeller gears 148. In turn, the rotation of the propeller gears 148 cause clockwise rotation of the propeller shaft 150. The clockwise rotation of the propeller shaft 150 cause a clockwise rotation of the rotating propeller 120.

Further illustrating flow of the coolant 110, the coolant 110 flows from the chamber path 128 into the component path 130 via respective openings 156 at a component-area entry 158 of each component area 106. More specifically, the coolant 110 flows through the inlet funnels 134 that direct the coolant 110 directly to the rotating propellers 120. The coolant 110 in the inlet funnels 134 flows along a pre-driven flow path 160. The rotating propellers 120, then, drive and accelerate the coolant 110 along the driven flow path 132, causing the coolant 110 in the driven flow path 132 to circulate at a faster speed than in any other flow paths. According to an example, the speed of the coolant 110 in the driven flow path 132 is faster than the speed of the coolant 110 in the pre-driven flow path 160, which in turn is faster than the speed of the coolant 110 in the chamber path 128.

According to optional configurations, the transmission of the rotatable force to the rotating propellers 120 is achieved via different transmission systems. For example, according to an alternative configuration, a single rotating propeller 120 is used to create a driven flow path 132 in multiple component areas 106. Thus, in this alternative configuration, there is a one rotating propeller 120-to-many component areas 106 ratio (instead of the one rotating propeller 120-to-one component area 106 ratio). In another example, according to another alternative configuration, multiple rotating propellers 120 are used to create a driven flow path 132 in a single component area 106. Thus, in this other alternative configuration, there are multiple rotating propellers 120-to-one component area 106 ((instead of the one rotating propeller 120-to-one component area 106 ratio). In yet another example, according to yet another alternative configuration, a single gear connection is used to drive multiple rotating propellers 120. Thus, a single gear connection that includes only one transmission gear 146 and only one propeller gear 148 transmits the required rotation to multiple propeller shafts 150, with each propeller shaft 150 having a respective rotating propeller 120.

Figure 5:
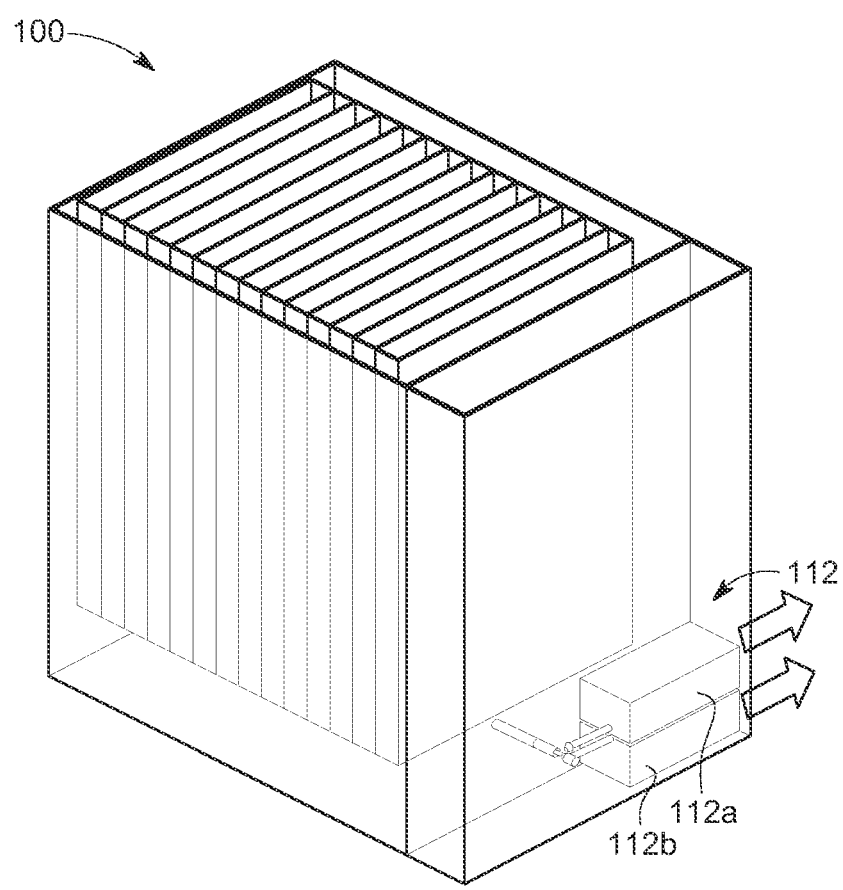
FIG. 5 is an isometric illustration showing a redundant motor system for the cooling system of FIG. 1, according to yet other aspects of the present disclosure.

Referring to FIG. 5, an optional configuration of the cooling system 100 has two motors 112 that provide a redundant cooling mode. The two motors 112 include a first motor 112a and a second motor 112b. If the first motor 112a fails or needs maintenance, the first motor 112a is removed while the second motor 112b continues the cooling mode. If the second motor 112b fails or needs maintenance, the second motor 112b is removed while the first motor 112a continues the cooling mode. Thus, one of the two motors 112 is on standby, as a backup, to take over the cooling mode if the other one of the two motors 112 fails.

According to alternative embodiments, the cooling system 100 has more than two motors, with additional redundant motors (e.g., a first backup motor, a second backup motor, etc.) to further decrease the likelihood of cooling failure. The additional redundant motors are beneficial especially when critical servers or other heat-generating electronic devices require protection from overheating.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A single-phase immersion cooling system comprising:
   an immersion cooling tank having a main chamber and a component area, the component area being separate from the main chamber and configured to receive a heat-generating electronic device;
   a coolant filling the immersion cooling tank, the coolant circulating along a flow path that includes a chamber path and a component path, the coolant in the chamber path flowing through the main chamber, the coolant in the component path flowing through the component area;
   a rotating propeller mounted within the immersion cooling tank, the rotating propeller causing a driven flow path in the component area, the driven flow path being configured to cause contact between the coolant in the driven flow path and the heat-generating electronic device when the heat-generating electronic device is received within the component area, the coolant in the driven flow path circulating at a faster speed than the coolant in the chamber path; and
   an inlet funnel located within the component area, the inlet funnel focusing the coolant towards the rotating propeller for enhancing cooling of the component area.

2. The single-phase immersion cooling system of claim 1, wherein the inlet funnel has a bell shape.

3. The single-phase immersion cooling system of claim 1, wherein the component area is defined at least in part by a component-area wall, the inlet funnel being defined by a funnel surface extending between a funnel entry end and a funnel exit end, the funnel surface extending to the component-area wall at the funnel entry end, the funnel surface being separated by a gap from the component-area wall at the funnel exit end.

4. The single-phase immersion cooling system of claim 1, further comprising a motor mechanically coupled to a transmission shaft, the transmission shaft transmitting a rotatable force from the motor to the rotating propeller.

5. The single-phase immersion cooling system of claim 4, wherein the motor is located external to the immersion cooling tank.

6. The single-phase immersion cooling system of claim 5, wherein the motor is mounted to the immersion cooling tank.

7. The single-phase immersion cooling system of claim 4, wherein the transmission shaft has an internal shaft portion and an external shaft portion, the internal shaft portion extending within the main chamber of the immersion cooling tank and being mechanically coupled to the rotating propeller, the external shaft portion extending outside the immersion cooling tank and being mechanically coupled to the motor.

8. The single-phase immersion cooling system of claim 4, wherein the transmission shaft includes a transmission gear mechanically coupled with a propeller gear for transmitting a rotatable force to the rotating propeller.

9. The single-phase immersion cooling system of claim 8, wherein the propeller gear is mounted on a propeller shaft, the propeller shaft being generally perpendicular to the transmission shaft.

10. The single-phase immersion cooling system of claim 1, wherein the component area is configured to have a shape and size for receiving a server tray or server chassis.

11. The single-phase immersion cooling system of claim 1, further comprising a pair of motors mechanically configured to cause rotation of the rotating propeller, a first motor of the pair of motors continuing to cause the rotation of the rotating propeller when failure of a second motor of the pair of motors occurs.

12. A single-phase immersion cooling system comprising:
an immersion cooling tank having a main chamber and a component area, the component area being configured to receive a heat-generating electronic device;
a coolant filling the immersion cooling tank, the coolant circulating along a flow path that includes (1) a chamber path flowing through the main chamber and (2) a component path flowing through the component area;
a rotating propeller mounted within the immersion cooling tank, the rotating propeller causing contact between the coolant and the heat-generating electronic device when the heat-generating electronic device is received within the component area; and
an inlet funnel located within the component area, the inlet funnel focusing the coolant towards the rotating propeller for enhancing cooling of the component area.

13. The single-phase immersion cooling system of claim 12, wherein the inlet funnel has a bell shape.

14. The single-phase immersion cooling system of claim 12, wherein the component area is defined at least in part by a component-area wall.

15. The single-phase immersion cooling system of claim 14, wherein the inlet funnel is defined by a funnel surface extending between a funnel entry end and a funnel exit end.

16. The single-phase immersion cooling system of claim 15, wherein the funnel surface extends to the component-area wall at the funnel entry end.

17. The single-phase immersion cooling system of claim 16, wherein the funnel surface is separated by a gap from the component-area wall at the funnel exit end.

18. A single-phase immersion cooling system comprising:
an immersion cooling tank having a main chamber and a component area, the component area being configured to receive a heat-generating electronic device;
a coolant filling the immersion cooling tank, the coolant circulating along a flow path that includes a chamber path and a component path, the coolant in the chamber path flowing through the main chamber, the coolant in the component path flowing through the component area;
a rotating propeller mounted within the immersion cooling tank, the rotating propeller causing contact between the coolant and the heat-generating electronic device when the heat-generating electronic device is received within the component area, the coolant in a driven flow path circulating at a faster speed than the coolant in a chamber path; and
an inlet funnel located within the component area, the inlet funnel focusing the coolant towards the rotating propeller for enhancing cooling of the component area;
wherein the component area is defined at least in part by a component-area wall, the inlet funnel being defined by a funnel surface extending between a funnel entry end and a funnel exit end, the funnel surface being separated by a gap from the component-area wall at the funnel exit end.

* * * * *